United States Patent
Hegde

(10) Patent No.: US 8,637,393 B1
(45) Date of Patent: Jan. 28, 2014

(54) METHODS AND STRUCTURES FOR CAPPING A STRUCTURE WITH A PROTECTIVE COATING

(71) Applicant: Rama I. Hegde, Austin, TX (US)

(72) Inventor: Rama I. Hegde, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/661,377

(22) Filed: Oct. 26, 2012

(51) Int. Cl.
   *H01L 21/44* (2006.01)
(52) U.S. Cl.
   USPC .......... 438/614; 438/612; 257/E21.508
(58) Field of Classification Search
   USPC .................................. 257/E21.513
   See application file for complete search history.

(56) References Cited

U.S. PATENT DOCUMENTS

| | | | |
|---|---|---|---|
| 5,086,966 A | 2/1992 | Melton et al. | |
| 5,872,400 A | 2/1999 | Chapman et al. | |
| 6,939,579 B2 * | 9/2005 | Bondestam et al. | 427/255.7 |
| 7,621,762 B2 | 11/2009 | Liaw | |
| 2006/0151580 A1 | 7/2006 | Flint | |

OTHER PUBLICATIONS

Coyle, R., et al., "A comprehensive analysis of the thermal fatigue reliability of SnPb and Pb free PBGA using backward and forward compatible assembly processes", SMTA Journal, vol. 21, Issue 4, 2008, p. 33-47.
Nippon Steel Technical Report, "Technical Development of Copper-Core Solder Ball for Flip Chip Interconnection", www.nssmc.com/en.tech/report/nsc/pdf/n9310.pdf, No. 92, Jul. 2005, pp. 30-31.
Schueller, R., et al., "Second Generation PB-free Alloys", SMTA Journal, vol. 23, Issue 1, 2010, pp. 18-26.
Shea, C., et al., "Low-Silver BGA Assembly Phase I-Reflow Considerations and Joint Homogeneity Initial Report", Originally Published in the Proceedings of APEX, 2008, Las Vegas, NV, pp. 1-8.

* cited by examiner

*Primary Examiner* — Cheung Lee
(74) *Attorney, Agent, or Firm* — Mary Jo Bertani; Joanna G. Chiu

(57) ABSTRACT

A surface is placed into a deposition chamber. A tin layer is formed on the surface, in which forming the tin layer includes providing a precursor into the deposition chamber for a first time period, wherein the precursor comprises one of tetrakis (dimethylamino) tin (TDMASn) or tin tetrachloride ($SnCl_4$), providing an inert gas into the deposition chamber for a second time period, providing a hydrogen reactant into the deposition chamber for a third time period, and providing the inert gas into the deposition chamber for a fourth time period. The first, second, third, and fourth time periods form one atomic layer deposition (ALD) cycle. The surface may be an exposed surface of a lead free metal.

18 Claims, 3 Drawing Sheets

METHODS AND STRUCTURES FOR CAPPING A STRUCTURE WITH A PROTECTIVE COATING

BACKGROUND

1. Field

This disclosure relates generally to protective coatings, and more specifically, to a method of depositing a protective coating on a structure or device.

2. Related Art

In many circumstances, it is desirable to deposit a protective coating over an exposed surface of a device or structure. For example, devices with lead-free solder compounds made of an alloy of tin (Sn), silver (Au), and copper (Cu) (referred to as SAC alloy) may be stored in a manner that leaves the SAC alloy exposed to the atmosphere. The SAC alloy may oxidize and/or become contaminated with sulphur, which may cause the device to be rejected due to reduced inability to form reliable of solder connections and/or discoloration of the device.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and devices disclosed herein provide a very thin protective coating that includes one or more layers of tin. The thickness of each layer of protective tin coating can range from 5 to 200 Angstroms when deposited over a surface. The tin coating helps prevent corrosion and oxidation that may otherwise form when the surfaces are exposed to atmospheric conditions. Devices that are not discolored and to which reliable connections can be formed are more likely to be accepted by a customer than devices that are discolored and corroded.

Figure 1:
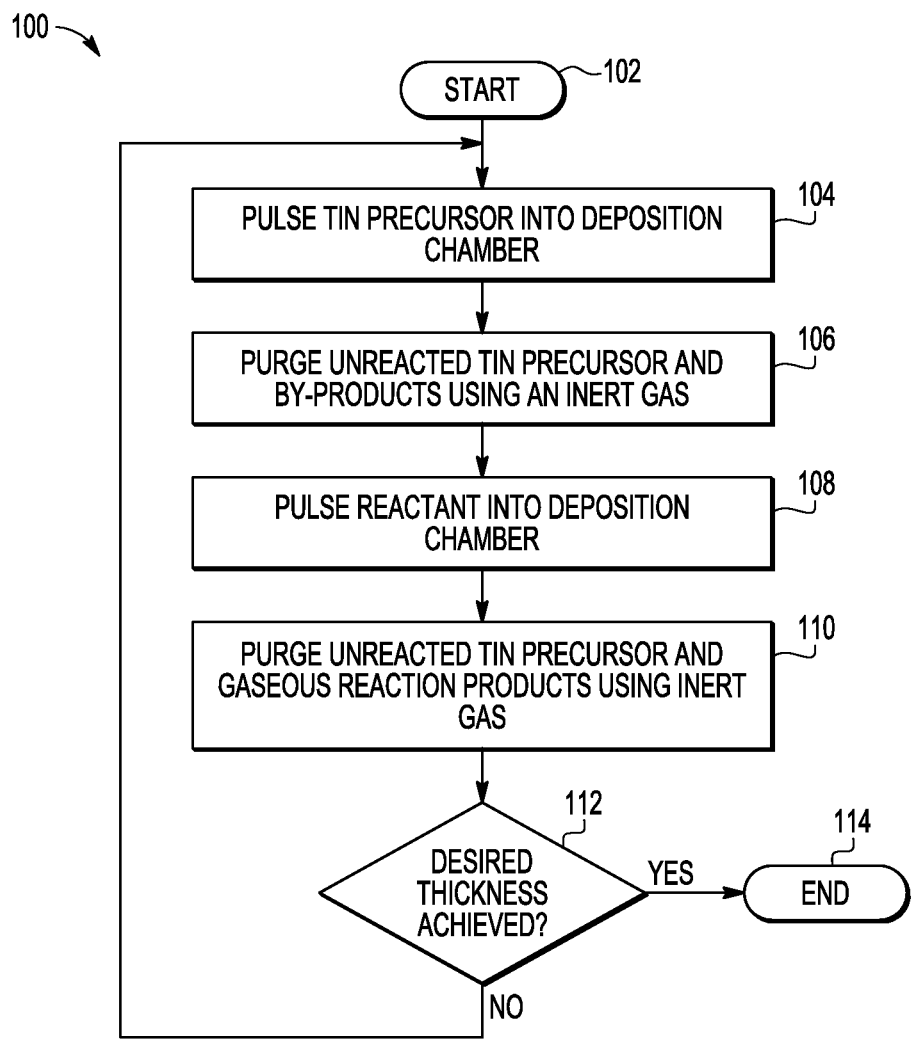
FIG. 1 shows a flow diagram of an embodiment of a method for depositing a protective coating in accordance with the present disclosure.

FIG. 1 shows a flow diagram of an embodiment of a method 100 for depositing one layer of a protective coating in accordance with the present disclosure. The protective coating may include one or more layers. Process 102 is the start of method 100 during which a device to be coated is placed in a deposition chamber. The portions of the device to be coated are exposed in the chamber. The exposed surfaces are formed of a material that is capable of bonding with tin at least at the surface level. The exposed surfaces can be, for example, lead-free solder spheres, a metal or combination of metals, an alloy, an oxide, a semiconductor, or other suitable material or combination of materials.

Process 102 transitions directly to atomic layer deposition (ALD) process 104 during which a precursor of tin is pulsed into the deposition chamber for a first specified period of time. The tin precursor can be one of tetrakis (dimethylamino) tin (TDMASn) or tin tetrachloride ($SnCl_4$). At least some of the tin precursor reacts with the exposed surfaces of the device and bonds with the top of the exposed surfaces. The deposition temperature in the ALD chamber is typically in a range of approximately 50 to 150° C. The deposition pressure typically ranges between approximately 0.1 and 10 Torr. The device is exposed to the precursor while the device is within the ALD chamber.

Process 104 transitions to process 106 during which the ALD chamber is purged of gas and other reaction products released during process 104. An inert gas such as nitrogen can be used to purge the ALD chamber. Additionally the inert gas can remove tin precursor that has not bonded or has formed incomplete bonds with the exposed surface.

Process 106 transitions to process 108 during which a reactant such as molecular hydrogen ($H_2$) or other suitable substance is pulsed into the deposition chamber. The reactant forms bonds with substances other than tin that remain on the surface of the device. For example, when $SnCl_4$ is used as the tin precursor and $H_2$ is used as the reactant, the reaction may be represented by the following chemical equation:

$$SnCl_4 + 2H_2 \rightarrow Sn + 4HCl$$

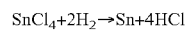

The tin is a solid that remains on the surface and the HCl is a gas that forms as a product of the reaction.

As another example, when TDMASn (molecular formula=$C_8H_{24}N_4Sn$) is used as the tin precursor, the reaction may be represented by the following chemical equation:

$$C_8H_{24}N_4Sn + 4H_2 \rightarrow Sn + 2N_2 + 8CH_4$$

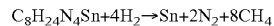

The tin is a solid that remains on the surface and the $N_2$ and the $CH_4$ are gases that form as product of the reaction.

Process 108 transitions to process 110 to purge the ALD chamber of unreacted reactant and gaseous reaction products of process 108 from the chamber. For example, when $SnCl_4$ is used as the precursor and $H_2$ is used as the reactant, process 110 can remove the HCl reaction product from the chamber. As another example, when $C_8H_{24}N_4Sn$ is used as the precursor and $H_2$ is used as the reactant, process 110 can remove the $N_2$ and $CH_4$ reaction products from the ALD chamber. An inert gas such as $N_2$ can be used in process 110. The resulting layer of tin is devoid of any other substances including other metals or oxides.

Process 112 determines whether the desired thickness of the tin coating has been achieved. If the desired thickness of the tin coating has not been achieved, process 112 transitions to process 104 to being another cycle of depositing a precursor over the surface, purging the ALD chamber of unreacted precursor and reaction products, pulsing a reactant into the chamber, and purging any unreacted reactant from the chamber. If the desired thickness of the tin coating has been achieved, process 112 transitions to process 114 to end method 100.

Since each layer of the tin coating may only be as thick as an atom of tin, several layers of tin may be applied to provide a target thickness of the protective coating. In some embodiments, a target thickness is between 5 and 200 Angstroms.

Figure 2:
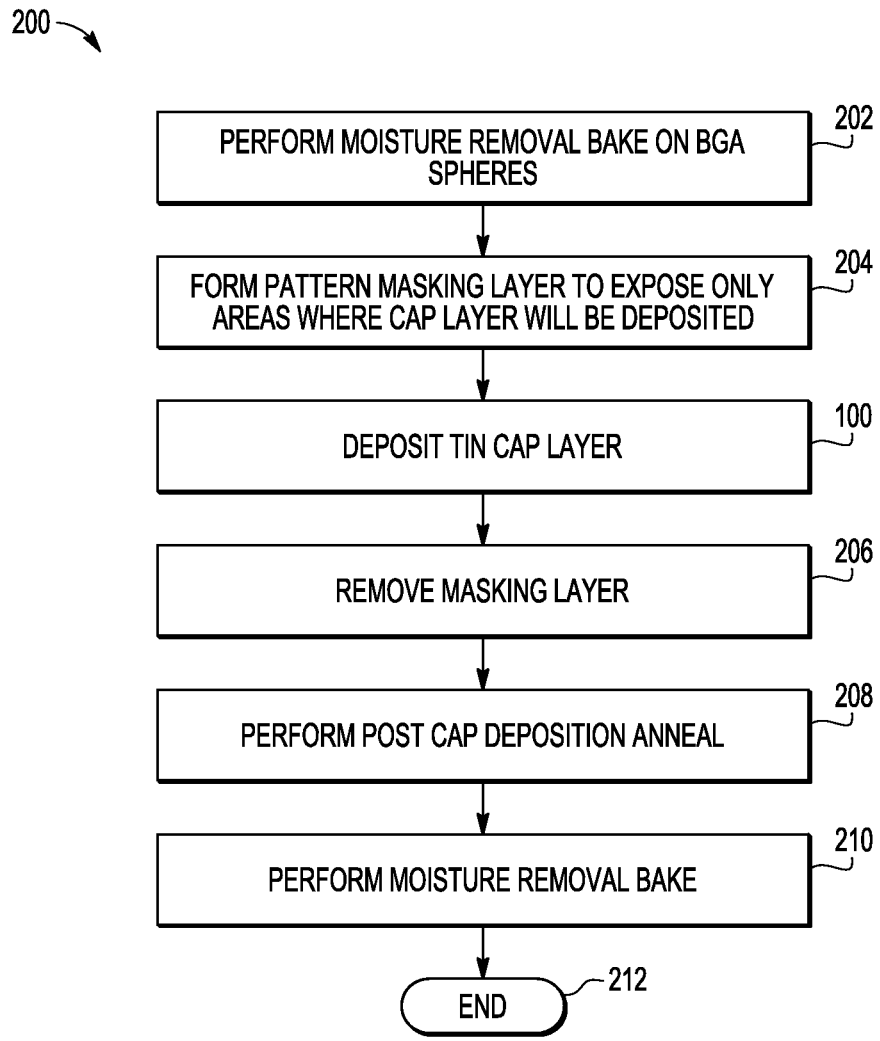
FIG. 2 shows a flow diagram of an embodiment of a method for coating a ball grid array using the method of FIG. 1.

FIG. 2 shows a flow diagram of an embodiment of a method 200 for coating a ball grid array using the method 100 of FIG. 1. Process 202 includes placing a device on which a ball grid array (BGA) has been formed in an oven to remove moisture from the BGA. For example, the BGA may be formed of spheres made of lead-free solder alloy containing tin, silver, and copper deposited on under-bump metal. The BGA device may be baked at a temperature of 125° C. for 16 hours or other suitable time and temperature.

Once the moisture has been removed, process 204 can be performed to form a masking layer to expose only the areas where the protective tin layer(s) are to be deposited. The mask may be formed using photoresist or a ceramic plate or stencil to cover the areas where the tin precursor should not be applied. Alternatively, the areas that are not to be exposed to the tin precursor can include a layer of material that is non-selective of the tin precursor so that the tin-precursor does not adhere to or bond with the non-selective material.

Following process 204, process 100 (FIG. 1) can be performed one or more times to deposit the target thickness of tin over the spheres of the BGA. Once the protective tin layer(s) are deposited and the target thickness is achieved, process 100 can transition to process 206 to remove the masking layer that was formed in process 204. If the masking layer does not need to be formed, process 204 and 206 are removed from process 200.

Whether or not process 206 is performed, method 200 transitions to process 208 to perform an anneal during which the density of the protective tin layer is increased and the continuity and uniformity of the tin is improved. The anneal may be performed at a temperature of 150° C. for 4 hours or other suitable time and temperature, and may be performed in an inert ambient such as a nitrogen ambient.

Process 208 transitions to process 210 during which the BGA device is again baked to remove moisture from the protective layer. The BGA device may be baked at a temperature of 125° C. for 16 hours or other suitable time and temperature.

Figure 3:
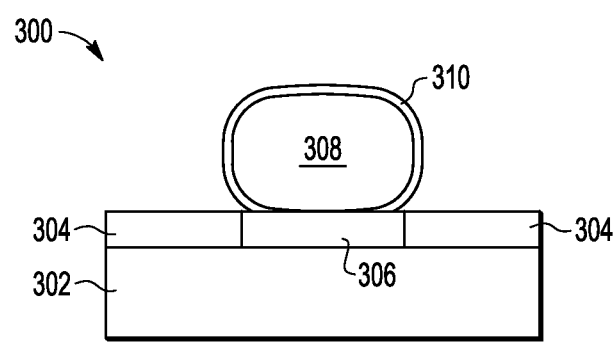
FIG. 3 shows a side view of a device with ball grid array after depositing a protective coating on the ball grid array using the method of FIG. 2.

FIG. 3 shows a side view of a device 300 with ball grid array (BGA) after a protective tin coating has been deposited on sphere 308 of BGA device 300 using the method 200 of FIG. 2. Although BGA 300 only shows one sphere 308, BGA device 300 may include any number of spheres 308, typically placed in a two-dimensional grid across the surface of substrate 302.

Substrate 302 may be any suitable semiconductor or non-conductive material such as silicon, germanium, plastic, or other suitable material. A solder mask 304 may be formed on substrate 302 that defines opening where under-bump metallurgy (UBM) 306 and spheres 308 are positioned on substrate. UBM 306 can be made of copper, copper-containing metal such as an alloy of nickel-copper-aluminum, or other suitable conductive metals. Solder sphere or bump 308 can be formed of lead-free solder compound such as tin-silver-copper (SAC), for example, SAC387, SAC405, SAC105, SAC305, or other suitable solder compound.

Protective tin coating or cap 310 is deposited over the exposed portions of sphere 310 at a thickness typically ranging from 5 to 200 Angstroms, however, other suitable thicknesses can be used. Tin coating 310 can be used to minimize oxide growth on sphere 308, improve wettability and solderability of sphere 308, and reduce sulphur contamination that could otherwise bind with the metals in sphere 308. Tin coating 310 can prevent degradation of sphere 308 even when BGA device 300 is stored in atmospheric conditions for extended periods of time before spheres 308 are reflowed to attach another device such as an integrated circuit die (not shown) to BGA device 300.

BGA device 300 can be used on a variety of surface mount application such as printed circuit boards, package substrates, and/or other applications.

Figure 4:
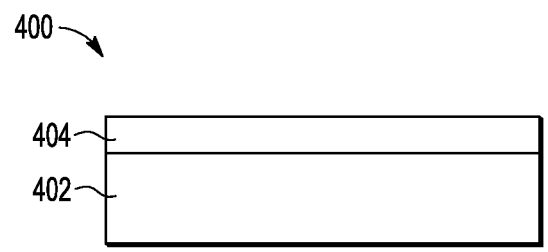
FIG. 4 shows a side view of an embodiment of a device after depositing a protective tin coating using the method of FIG. 1.

FIG. 4 shows a side view of an embodiment of a device 400 after depositing a protective tin coating 404 on substrate 402 using the method 100 of FIG. 1. Substrate 402 may be any material that is subject to oxidation or corrosion from sulphur or other contaminant(s) being absorbed by one or more of the substances in substrate 402. Substrate 402 may be, for example, a copper leadframe, a chip carrier, package substrate, silicon substrate, germanium substrate, or other device that may be subject to corrosion, discoloration, and/or oxidation. Tin coating 404 applied with the atomic layer deposition method 100 of FIG. 1 provides a very thin protective film that can be deposited using existing ALD deposition chambers.

By now it should be appreciated that in some embodiments, a method 100 for forming tin on a surface 308, 402 can comprise placing the surface into a ALD deposition chamber, and forming a tin layer 310, 404 on the surface. The tin layer can be formed by providing 104 a precursor into the deposition chamber for a first time period. The precursor can comprise one of tetrakis (dimethylamino) tin (TDMASn) or tin tetrachloride (SnCl4). After providing the precursor for the first time period, an inert gas is provided 106 into the deposition chamber for a second time period. After providing the inert gas for the second time period, a hydrogen reactant is provided 108 into the deposition chamber for a third time period. After providing the hydrogen reactant for the third time period, the inert gas is provided 110 into the deposition chamber for a fourth time period.

In another aspect, the first, second, third, and fourth time periods form one atomic layer deposition ALD cycle.

In another aspect, the tin layer can be formed by repeating 212 the forming the tin layer until the tin layer reaches a target thickness.

In another aspect, the target thickness is in a range of 5 to 200 Angstroms.

In another aspect, the surface is characterized as an exposed surface of a semiconductor substrate.

In another aspect, the surface is characterized as an exposed surface of a lead-free metal layer.

In another aspect, the surface is characterized as an exposed surface of a lead-free solder sphere.

In another aspect, the method can further comprise performing an anneal 208 of the tin layer after forming the tin layer.

In another aspect, the method can further comprise performing a moisture removal bake 202 on the surface prior to forming the tin layer.

In another aspect, the tin layer is devoid of oxide.

In another embodiment, a method for forming tin on solder spheres of a ball grid array BGA device can include placing the BGA device 300 into a deposition chamber and forming a tin layer on the solder spheres. Forming the tin layer can include providing 104 a precursor into the deposition chamber for a first time period. The precursor can comprise one of tetrakis (dimethylamino) tin (TDMASn) or tin tetrachloride (SnCl4). After providing the precursor for the first time period, the method can further comprise providing 106 an inert gas into the deposition chamber for a second time period. After providing the inert gas for the second time period, a hydrogen reactant can be provided 108 into the deposition chamber for a third time period. After providing the hydrogen reactant for the third time period, the inert gas can be provided into the deposition chamber for a fourth time period.

In another aspect, the solder spheres of the BGA device are characterized as lead free.

In another aspect, the solder spheres comprise an alloy of tin, silver, and copper.

In another aspect, the first, second, third, and fourth time periods form one atomic layer deposition ALD cycle.

In another aspect, the forming the tin layer on the solder spheres can further comprise repeating 212 the forming the tin layer until the tin layer reaches a target thickness.

In another aspect, the target thickness is in a range of 5 to 200 Angstroms.

In another aspect, the method can further comprise after the forming the tin layer, performing an anneal 208 of the BGA device.

In another aspect, the method can further comprise prior to the forming the tin layer, performing a moisture removal bake 202 on the BGA device.

In yet other embodiments, a ball grid array BGA device can comprise a plurality of lead free solder spheres 308 and a tin layer 310 directly on each lead free solder sphere. The tin layer can have a thickness of at most 20 Angstroms.

In another aspect, each of the lead free solder spheres comprises an alloy of tin, silver, and copper.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming tin on a surface, the method comprising:
   placing the surface into a deposition chamber;
   forming a tin layer on the surface, wherein the forming the tin layer comprises:
      providing a precursor into the deposition chamber for a first time period, wherein the precursor comprises one of tetrakis (dimethylamino) tin (TDMASn) or tin tetrachloride ($SnCl_4$);
      after providing the precursor for the first time period, providing an inert gas into the deposition chamber for a second time period;
      after providing the inert gas for the second time period, providing a hydrogen reactant into the deposition chamber for a third time period; and
      after providing the hydrogen reactant for the third time period, providing the inert gas into the deposition chamber for a fourth time period.

2. The method of claim 1, wherein the first, second, third, and fourth time periods form one atomic layer deposition (ALD) cycle.

3. The method of claim 2, wherein the forming the tin layer further comprises:
   repeating the forming the tin layer until the tin layer reaches a target thickness.

4. The method of claim 3, wherein the target thickness is in a range of 5 to 200 Angstroms.

5. The method of claim 1, wherein the surface is characterized as an exposed surface of a semiconductor substrate.

6. The method of claim 1, wherein the surface is characterized as an exposed surface of a lead-free metal layer.

7. The method of claim 1, wherein the surface is characterized as an exposed surface of a lead-free solder sphere.

8. The method of claim 1, further comprising:
   after the forming the tin layer, performing an anneal of the tin layer.

9. The method of claim 8, further comprising:
   prior to the forming the tin layer, performing a moisture removal bake on the surface.

10. The method of claim 1, wherein the tin layer is devoid of oxide.

11. A method for forming tin on solder spheres of a ball grid array (BGA) device, the method comprising:
    placing the BGA device into a deposition chamber;
    forming a tin layer on the solder spheres, wherein the forming the tin layer comprises:
       providing a precursor into the deposition chamber for a first time period, wherein the precursor comprises one of tetrakis (dimethylamino) tin (TDMASn) or tin tetrachloride ($SnCl_4$);
       after providing the precursor for the first time period, providing an inert gas into the deposition chamber for a second time period;
       after providing the inert gas for the second time period, providing a hydrogen reactant into the deposition chamber for a third time period; and
       after providing the hydrogen reactant for the third time period, providing the inert gas into the deposition chamber for a fourth time period.

12. The method of claim 11, wherein the solder spheres of the BGA device are characterized as lead free.

13. The method of claim 12, wherein the solder spheres comprise an alloy of tin, silver, and copper.

14. The method of claim 11, wherein the first, second, third, and fourth time periods form one atomic layer deposition (ALD) cycle.

15. The method of claim 11, wherein the forming the tin layer on the solder spheres further comprises:
    repeating the steps of providing until the tin layer reaches a target thickness.

16. The method of claim 15, wherein the target thickness is in a range of 5 to 200 Angstroms.

17. The method of claim 11, further comprising:
    after the forming the tin layer, performing an anneal of the BGA device.

18. The method of claim 11, further comprising:
    prior to the forming the tin layer, performing a moisture removal bake on the BGA device.

* * * * *